(12) United States Patent
Schwartz

(10) Patent No.: US 8,723,578 B1
(45) Date of Patent: May 13, 2014

(54) PULSE GENERATOR CIRCUIT

(71) Applicant: Palo Alto Research Center Incorporated, Palo Alto, CA (US)

(72) Inventor: David Eric Schwartz, San Carlos, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 0 days.

(21) Appl. No.: 13/715,675

(22) Filed: Dec. 14, 2012

(51) Int. Cl.
*H03K 3/00* (2006.01)

(52) U.S. Cl.
USPC ............................ 327/291; 327/172; 327/299

(58) Field of Classification Search
USPC .................... 327/172, 291, 299, 309–319
See application file for complete search history.

(56) References Cited

U.S. PATENT DOCUMENTS

| | | | | |
|---|---|---|---|---|
| 4,255,756 | A * | 3/1981 | Shimotori et al. | 257/299 |
| 4,446,384 | A * | 5/1984 | Taira | 327/537 |
| 6,472,918 | B1 * | 10/2002 | Mosinskis et al. | 327/175 |
| 7,288,980 | B2 * | 10/2007 | Lundberg | 327/298 |
| 7,586,353 | B2 * | 9/2009 | Li | 327/291 |

\* cited by examiner

*Primary Examiner* — An Luu
(74) *Attorney, Agent, or Firm* — Hollingsworth Davis, LLC

(57) ABSTRACT

A pulse generator circuit is disclosed that is optimized for printed, solution-processed thin film transistor processing. In certain embodiments, the circuit comprises dual thin film transistors that operate as a diode and resistor, respectively. Optionally, a third thin film transistor may be provided to operate as a pass transistor in response to an enable signal. The elements of the circuit are configured such that a rising pulse on an input node triggers an output pulse on an output node in the manner of a monostable multivibrator.

19 Claims, 6 Drawing Sheets

PULSE GENERATOR CIRCUIT

BACKGROUND

The present disclosure is related to digital electronic circuits, and more specifically to a pulse generator circuit optimized for printed, solution processed thin-film devices.

A pulse generator, also called a monostable multivibrator or one-shot, is a common element of many circuits in a wide range of applications. One common use is for switch debouncing. Another is as a reset signal generator. The input to a one-shot is an edge or pulse and the output is a positive or negative voltage pulse. The duration and magnitude of the pulse can be fixed or settable and are generally constrained to fall within ranges specified for the application. FIG. 1 shows a timing diagram of an example of a one-shot circuit.

A common circuit implementation of a monostable multivibrator includes an inverter and a NAND or NOR gate. FIG. 2 is an example of such an implementation. This circuit is a rising-edge-triggered negative pulse generator. In this circuit, input signal In is normally low, and inverter output D is high, making output signal Out high. When a rising edge is sent to In, output Out switches to low until the edge propagates through the inverter to D. Once D switches to low, Out returns to the high state. The duration of the pulse is determined by the propagation delay through the inverter. This can be controlled by the sizes of the transistors making up the inverter and NAND gate and/or by including additional delay elements, such as additional inverters or capacitors, to the D signal. Of course, many other implementations are known in the art.

There is a desire to produce devices such as the aforementioned monostable multivibrator using printed thin-film processes such as, but not limited to, those employing organic thin film (OTF) material systems. OTF fabrication processes are much less mature than crystalline silicon technologies, and direct implementation of conventional complementary designs is challenging due to the relatively low yield, high variability, and instability of devices formed by printed OTF processes. For example, in certain of such process reliable fabrication of all integrated devices in a single process is problematic. Further, according to some OTF processes, only one or the other of N- and P-channel devices may be formed (not both simultaneously). In processes capable of producing both N- and P-channel devices, one device type often has significantly higher performance than the other. And, process-based limits on device size in combination with large parasitic capacitances limit design of devices having desired pulse widths.

In light of these limitations, there is a need in the art for a device design capable of use within the context of OTF processes, such as circuit designs that include a minimum number of thin-film transistors (TFTs) and a single polarity. Such are disclosed herein.

SUMMARY

Accordingly, the present disclosure is directed to circuit designs for converting an edge output by a sensor to a signal that addresses the difficulties of forming such circuits using solution-based and printed processes. The circuits provide a pulse sustained above a voltage threshold for a minimum time interval. Applications include clocking flip-flops, generating reset signals, polarizing a memory cell, and so on. The devices may be fabricated in an all-additive inkjet process. For the clarity and simplicity, processing using organic material (organic thin-film, OTF) is referred to below as an example of solution-based printed process, although it will be appreciated that many different types of solutions and materials, whether organic or inorganic, are contemplated herein and within the scope of the present disclosure. Therefore, OTF and organic material will be understood to be examples only, and the scope of the disclosure not limited thereby.

According to one aspect of the disclosure, an electronic pulse-generator circuit comprises: an input node; a capacitor communicatively connected at to the input node and to a pulse line; a first thin film transistor having a channel formed of a first polarity organic semiconductor material, a first side of the channel communicatively connected to a first voltage source, a second side of the channel communicatively connected to the pulse line, the first thin film transistor configured to function as a diode; a second thin film transistor having a channel formed of the first polarity organic semiconductor material, a first side of the channel communicatively connected to the pulse line, a second side of the channel communicatively connected to a second voltage source (e.g., ground), the second thin film transistor configured to function as a resistor; and an output node communicatively connected to receive a pulse from the pulse line.

Implementations of this aspect may also include a third thin film transistor having a channel formed of the first polarity organic semiconductor material, a first side of said channel communicatively connected to the pulse line, a second side of the channel communicatively connected to the output node, and further comprising a gate communicatively connected to a first enable signal line.

According to another aspect of the disclosure, the first polarity organic semiconductor material is p-type.

Implementations may also include the first thin film transistor further comprising a gate communicatively connected to the pulse line at the capacitor, and further wherein the second thin film transistor further comprises a gate communicatively connected to the second voltage source (e.g., ground).

Other implementations of the present disclosure are also provided and discussed in greater detail, below. Thus, the above is merely a brief summary of a number of unique aspects, features, and advantages of the present disclosure. The above summary is not intended to be nor should it be read as an exclusive identification of aspects, features, or advantages of the claimed subject matter. Therefore, the above summary should not be read as imparting limitations to the claims nor in any other way determining the scope of said claims.

It should be noted that the present disclosure focuses on solution-proceed devices. These are devices having one or more layers formed from the deposition of materials solution phase, which solidify (such as by evaporation). One form of solution processing is printing of patterned solution. Materials capable of solution processing may be either organic or inorganic. While this disclosure uses printed organic semiconductor technologies as an example, the invention is equally applicable to other process technologies. Furthermore, the invention can be implemented in other TFT technologies that are not solution based. Therefore, in this disclosure, references to solution processing, printing, and organic materials should be read as examples, not limiting distinctions.

BRIEF DESCRIPTION OF THE DRAWINGS

In the drawings appended hereto like reference numerals denote like elements between the various drawings. While illustrative, the drawings are not drawn to scale. In the drawings.

DETAILED DESCRIPTION

We initially point out that description of well-known starting materials, processing techniques, components, equipment and other well-known details may merely be summarized or are omitted so as not to unnecessarily obscure the details of the present disclosure. Thus, where details are otherwise well-known, we leave it to the application of the present disclosure to suggest or dictate choices relating to those details.

Figure 1:
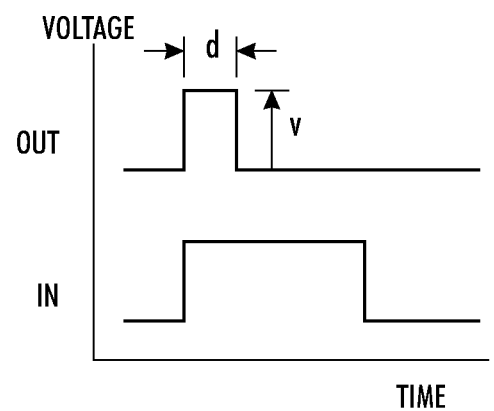
FIG. 1 is a timing diagram of a positive-edge-triggered one-shot circuit with pulse duration, d, and voltage amplitude, v, as known in the art.
Figure 2:
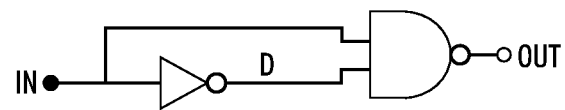
FIG. 2 is an implementation of a monostable multivibrator including an inverter and a NAND or NOR gate as known in the art.
Figure 3A:
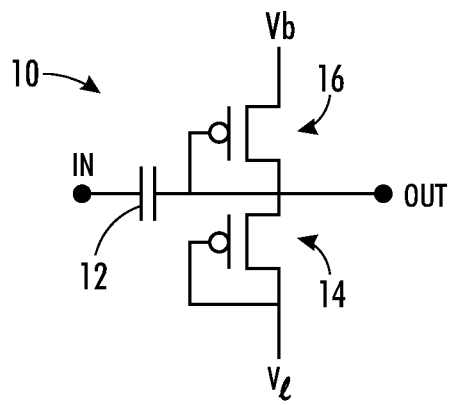
FIG. 3A is a schematic illustration of one embodiment of a pulse generator circuit, tailored for fabrication by organic thin-film processes, according to the present disclosure.
Figure 3B:
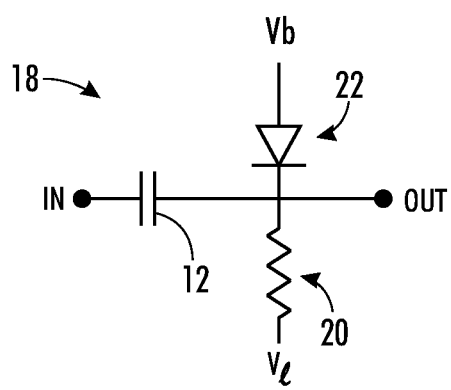
FIG. 3B is a schematic illustration of an equivalent circuit to that shown in FIG. 3A of an embodiment of a pulse generator circuit, tailored for fabrication by organic thin-film processes, according to the present disclosure.

With reference to FIG. 3A, there is shown therein a first embodiment of a pulse generator circuit 10 tailored for fabrication by organic thin-film (OTF) processes. Circuit 10 comprises an input In, and output Out, a capacitor 12, a first thin-film transistor (TFT) 14, and a second TFT 16, each of the same polarity. Circuit 10 of FIG. 3A is intended to model a circuit 18 shown in FIG. 3B, in that TFT 14 models resistor 20 and TFT 16 models diode 22, with operation as follows. A rising edge on In of circuit 10 is passed though a high-pass filter made up of capacitor 12 and TFT 14 (e.g., resistor 20) to Out. Diode bias $V_b$ is set to a voltage such that TFT 16 (e.g., diode 22, FIG. 3B) prevents Out from being negative. Voltage $V_b$ is approximately one diode-drop above ground. Depending on the implementation, negative voltages may be allowed on signal Out, in which case $V_b$ can simply be set to ground. Other values of $V_b$ may also be acceptable, depending on the application. In some implementations, one or both of the TFTs 14, 16 can be replaced by their equivalent components, 20 and 22, respectively, where diodes and resistors are available. Also capacitor 12 can be implemented in the OTF process (for example, with gate dielectric between gate and source/drain metal layer with no semiconductor) or separately.

Figure 4:
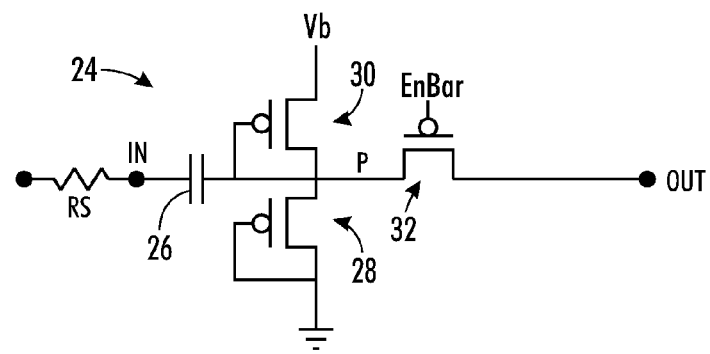
FIG. 4 is a schematic illustration of an alternate embodiment of a pulse generator circuit, tailored for fabrication by organic thin-film processes, according to the present disclosure.

FIG. 4 shows a first alternate embodiment of a pulse generator circuit 24 tailored for fabrication by organic thin-film (OTF) processes. Circuit 24 comprises an input In, and output Out, a capacitor 26, a first thin-film transistor (TFT) 28 (acting as a resistor), and a second TFT 30, each of the same polarity, similar to the embodiment illustrated and described above with regard to FIG. 3A. Circuit 24 further comprises a pass TFT 32 connecting the output of the circuit to a load. A rising edge on In generates a pulse at P. The generation of a complimentary negative pulse with a falling edge is prevented by TFT 30, which is sized much wider than TFT 28 to function as a diode. The dc value of P is given by $V_b$ minus the threshold voltage of TFT 30 ($V_{30}$), and may be set to ground (but can be other values). In particular, if an additional voltage rail is not available or desired, $V_b$ can be tied to ground and P clamped at $-V_{30}$. A low signal on EnBar will pass the pulse P to Out through TFT 32. (The on-characteristic of TFT 32 will further filter the pulse signal.)

In principal, the sizes of TFTs such as 14 and 16, 28 and 30, etc. are determined based on the source impedance seen at In. The transfer function from the source to P is given by $$f = \frac{sCR_x}{sC(R_x + R_s) + 1}$$

where $R_x$ is the channel resistance of TFT 28 for a positive pulse and of TFT 30 for a negative pulse, $R_s$ is the source impedance, C is the capacitance of capacitor 26, and s is the Laplace parameter. The source impedance Rs is the output impedance of the circuit driving the pulse generator and is not part of the pulse generator circuit itself. At high frequency ($s \to \infty$), the transfer function is approximately 1 when $R_x \gg R_s$ and approximately 0 when $R_x \ll R_s$. TFT 30 acts as a diode in the sense that it is off during a positive pulse and on during a negative pulse. Thus, if $R_{on}$ of TFT 28 is much greater than $R_s$, and $R_{on}$ of TFT 30 is much less than $R_s$, positive pulses will be generated while negative pulses are shunted. In practice, the on-resistance of TFT 32 is usually non-negligible and will be accounted for in the transfer function analysis.

The circuit described above may be fabricated on a flexible polyethylene naphthalate substrate by an additive OFT process that includes ink-jet deposition of the metal and semiconductor layers. The capacitor may be a parallel plate structure formed by the gate dielectric and the source-drain and gate metals. Other substrate materials and structures may be employed depending on the design criteria and application of embodiments of the present disclosure.

Alternatively, if both n- and p-channel devices are available, a transmission gate can be used. By placing multiple pass transistors in parallel, the pulse can be selectively connected to one or more of several outputs.

The sizes of TFTs 14, 16 of embodiment 10 (FIG. 3A) and TFTs 28, 30, 32 of embodiment 24 (FIG. 4) are highly dependent on the application and implementation of the respective circuits, in particular on the characteristics of the TFTs themselves (threshold voltage, mobility, etc.), the process design rules (minimum channel length, available channel widths), and the load resistance and capacitance. Additionally, they are dependent on the desired pulse duration and shape.

Figure 5:
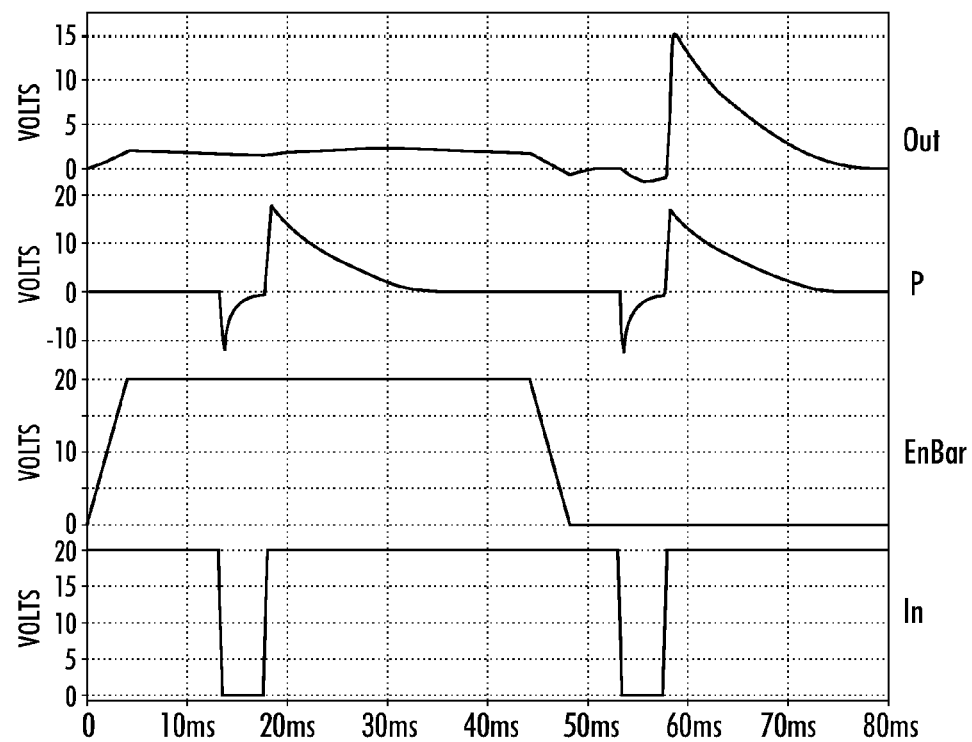
FIG. 5 is a plot of a simulation illustrating various voltages on lines as a function of time for the embodiment shown in FIG. 4.

FIG. 5 shows In, EnBar, P, and Out values plotted against time in a simulation of circuit 24 (FIG. 4) for a printed OTF process. In this simulation, a 20-volt input step, $V_b$=0 volts, and a 10 pF capacitive load were used. A capacitance of capacitor 26 was 200 pF. Each of TFTs 28, 30, and 32 had a channel length of 35 μm. The channel widths of TFTs 28, 30 and 32 were 200 μm, 6 mm, and 400 μm, respectively. In general, the length and width are process dependent. According to one embodiment, length may range from 2 μm to 200 μm, and widths may range from 100 μm to 1 cm. It will be noted that a rising pulse on In (at approximately 58 ms) triggers a pulse on Out when EnBar is low.

Figure 6:
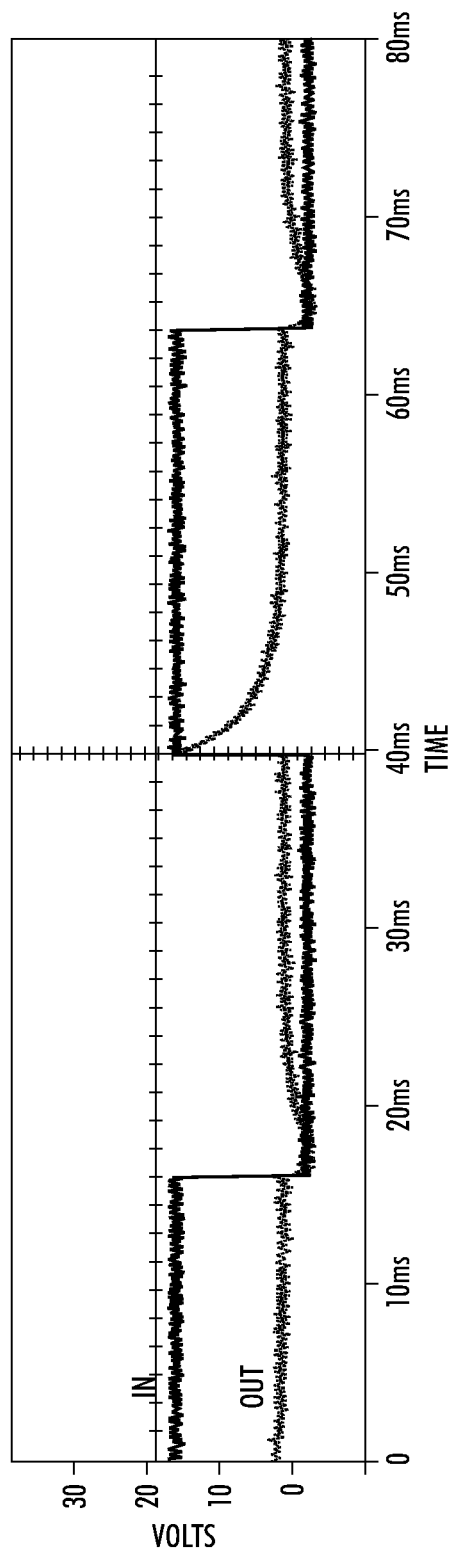
FIG. 6 is a plot of In and Out voltages for an actual example of the circuit of FIG. 4 plotted against time.
Figure 7:
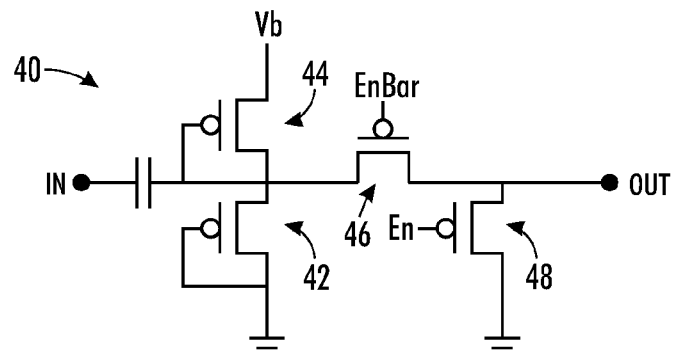
FIG. 7 is a schematic illustration of another alternate embodiment of a pulse generator circuit, tailored for fabrication by organic thin-film processes, according to the present disclosure.

FIG. 6 shows measured output of circuit 24 (FIG. 4). Each of TFTs 28, 30, and 32 had a approximate channel length of 35 μm. The channel widths of TFTs 28, 30 and 32 were approximately 200 μm, 6 mm, and 400 μm, respectively. The voltage $V_b$ was 3.5 volts. Capacitor 26 had a value of 200 pF. Again, it will be noted that a rising pulse on In (at 40 ms) triggers an output pulse.

Figure 8:
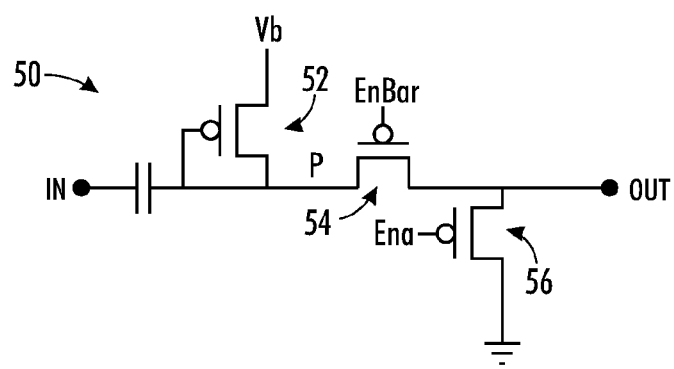
FIG. 8 is a schematic illustration of yet another alternate embodiment of a pulse generator circuit, tailored for fabrication by organic thin-film processes, according to the present disclosure.
Figure 9:
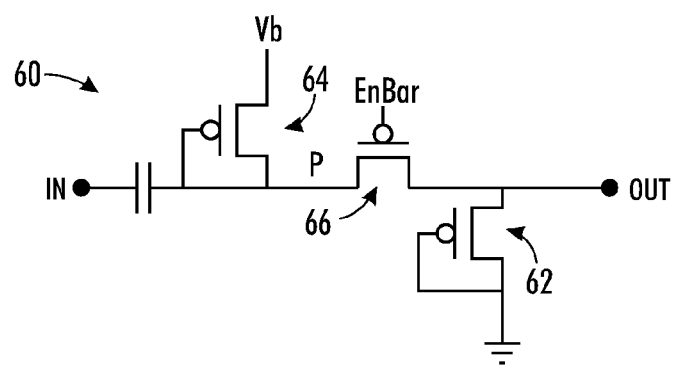
FIG. 9 is a schematic illustration of still another alternate embodiment of a pulse generator circuit, tailored for fabrication by organic thin-film processes, according to the present disclosure.

Illustrated in FIGS. 7 through 11 are various alternate embodiments of a pulse generator circuit tailored for fabrication by OTF processes. More specifically, FIG. 7 includes TFTs 42, 44, and 46 similar to those described with reference to FIG. 4. In addition, the circuit of FIG. 7 includes an additional enable TFT 48, enabled when a voltage En is high. In typical operation, signal En is the complement of EnBar at all times. When En is low (disabled), TFT 48 serves to aid in clamping Out near ground. FIG. 8 is an alternate embodiment for filtering the pulse on Out in which TFT 42 from FIG. 7 has been eliminated, leaving TFTs 52, 54, and 56. In function, TFT 56 serves in place of TFT 28 of FIG. 4. Here, Ena at the gate of TFT 56 is an analog voltage that sets the effective resistance of TFT 56. FIG. 9 is a modification of the circuit of FIG. 4 including TFTs 62, 64, 66, in which TFT 62 corresponding to the resistor (20 of FIG. 3B) has been relocated to the output side of TFT 66.

Figure 10:
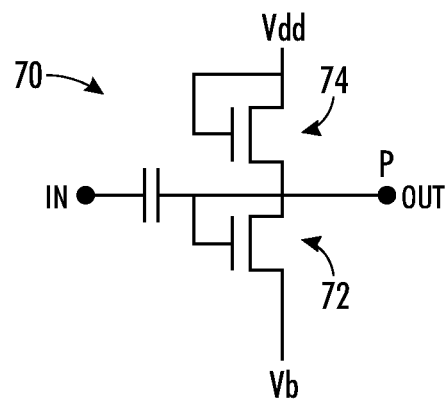
FIG. 10 is a schematic illustration of a still further alternate embodiment of a pulse generator circuit, tailored for fabrication by organic thin-film processes, according to the present disclosure.
Figure 11:
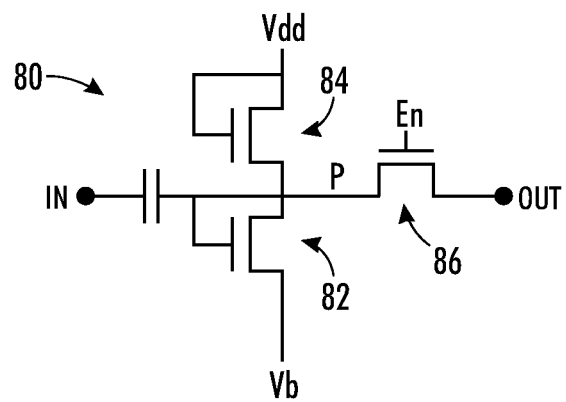
FIG. 11 is a schematic illustration of an additional alternate embodiment of a pulse generator circuit, tailored for fabrication by organic thin-film processes, according to the present disclosure.

FIG. 10 is an illustration of a N-channel TFT implementation of the circuit illustrated in FIG. 3A, including N-channel TFTs 72, 74. FIG. 11 is an illustration of a N-channel TFT implementation of the circuit illustrated in FIG. 4, including N-channel TFTs 82, 84, 86.

The physics of modern electrical devices and the methods of their production are not absolutes, but rather statistical efforts to produce a desired device and/or result. Even with the utmost of attention being paid to repeatability of processes, the cleanliness of manufacturing facilities, the purity of starting and processing materials, and so forth, variations and imperfections result. Accordingly, no limitation in the description of the present disclosure or its claims can or should be read as absolute. The limitations of the claims are intended to define the boundaries of the present disclosure, up to and including those limitations. To further highlight this, the term "substantially" may occasionally be used herein in association with a claim limitation (although consideration for variations and imperfections is not restricted to only those limitations used with that term). While as difficult to precisely define as the limitations of the present disclosure themselves, we intend that this term be interpreted as "to a large extent", "as nearly as practicable", "within technical limitations", and the like.

While examples and variations have been presented in the foregoing description, it should be understood that a vast number of variations exist, and these examples are merely representative, and are not intended to limit the scope, applicability or configuration of the disclosure in any way. Various of the above-disclosed and other features and functions, or alternative thereof, may be desirably combined into many other different systems or applications. Various presently unforeseen or unanticipated alternatives, modifications variations, or improvements therein or thereon may be subsequently made by those skilled in the art which are also intended to be encompassed by the claims, below.

Therefore, the foregoing description provides those of ordinary skill in the art with a convenient guide for implementation of the disclosure, and contemplates that various changes in the functions and arrangements of the described examples may be made without departing from the spirit and scope of the disclosure defined by the claims thereto.

What is claimed is:

1. An electronic pulse-generator circuit, comprising:
   an input node;
   a capacitor communicatively connected to said input node and to a pulse line;
   a first thin film transistor having a channel formed of a first polarity solution-processed semiconductor material, a first side of said channel communicatively connected to a first voltage source, a second side of said channel communicatively connected to said pulse line, said first thin film transistor configured to function as a diode;
   a second thin film transistor having a channel formed of said first polarity solution-processed semiconductor material, a first side of said channel communicatively connected to said pulse line, a second side of said channel communicatively connected to a second voltage source, said second thin film transistor configured to function as a resistor;
   a third thin film transistor having a channel formed of said first polarity solution-processed semiconductor material, a first side of said channel communicatively connected to said pulse line, and further comprising a gate communicatively connected to a first enable signal line; and
   an output node communicatively connected to a second side of said channel of said third thin film transistor to thereby receive a pulse therefrom.

2. The electronic pulse-generator circuit of claim 1 wherein said first polarity solution-processed semiconductor material is P-type.

3. The electronic pulse-generator circuit of claim 1, further comprising a fourth thin film transistor having a channel formed of said first polarity solution-processed semiconductor material, a first side of said channel communicatively connected to said pulse line at said output node, a second side of said channel communicatively connected to a third voltage source, and further comprising a gate communicatively connected to a second enable signal line.

4. The electronic pulse-generator circuit of claim 1, wherein said first side of said channel of said second thin film transistor is communicatively connected to said pulse line at said output node.

5. The electronic pulse-generator circuit of claim 4, wherein said second thin film transistor further comprises a gate communicatively connected to a third enable signal line.

6. The electronic pulse-generator circuit of claim 1, wherein said second voltage source is ground.

7. The electronic pulse-generator circuit of claim 1, wherein said first polarity solution-processed semiconductor material is N-type.

8. The electronic pulse-generator circuit of claim 7, wherein said first thin film transistor comprises a gate communicatively connected to said first voltage source, and further wherein said second thin film transistor further comprises a gate communicatively connected to said pulse line, said capacitor, and said second side of said channel of said first thin film transistor.

9. The electronic pulse-generator circuit of claim 1, wherein said first thin film transistor further comprises a gate communicatively connected to said pulse line, said capacitor, and said second side of said channel of said first thin film transistor, and further wherein said second thin film transistor further comprises a gate communicatively connected to ground.

10. The electronic pulse-generator circuit of claim 1, wherein said first polarity solution-processed semiconductor material is N-type.

11. The electronic pulse-generator circuit of claim 10, wherein said first thin film transistor comprises a gate communicatively connected to said voltage source, and further wherein said second thin film transistor further comprises a gate communicatively connected to said pulse line, said capacitor, and said second side of said channel of said first thin film transistor.

12. An electronic pulse-generator circuit, comprising:
an input node;
an output node;
a capacitor communicatively connected to said input node and to a pulse line;
a first thin film transistor having a channel formed of a p-type solution-processed semiconductor material, a first side of said channel communicatively connected to a voltage source, a second side of said channel communicatively connected to said pulse line, said first thin film transistor configured to function as a diode;
a second thin film transistor having a channel formed of p-type solution-processed semiconductor material, a first side of said channel communicatively connected to said pulse line, a second side of said channel communicatively connected to ground, said second thin film transistor configured to function as a resistor; and
a third thin film transistor having a channel formed of p-type solution-processed semiconductor material, a first side of said channel communicatively connected to said pulse line, a second side of said channel communicatively connected to said output node, and further comprising a gate communicatively connected to a first enable signal line.

13. The electronic pulse-generator circuit of claim 12, further comprising a fourth thin film transistor having a channel formed of p-type solution-processed semiconductor material, a first side of said channel communicatively connected to said pulse line at said output node, a second side of said channel communicatively connected to ground, and further comprising a gate communicatively connected to a second enable signal line.

14. The electronic pulse-generator circuit of claim 12, wherein said first side of said channel of said second thin film transistor is communicatively connected to said pulse line at said output node.

15. The electronic pulse-generator circuit of claim 14, wherein said second thin film transistor further comprises a gate communicatively connected to a third enable signal line.

16. The electronic pulse-generator circuit of claim 15, wherein said third enable signal line is communicatively connected to ground.

17. An electronic pulse-generator circuit, comprising:
an input node;
an output node;
a capacitor communicatively connected to said input node and to a pulse line;
a first thin film transistor having a channel formed of a printed p-type organic semiconductor material, a first side of said channel communicatively connected to a voltage source, a second side of said channel communicatively connected to said pulse line, said first thin film transistor configured to function as a diode;
a second thin film transistor having a channel formed of a printed p-type organic semiconductor material, a first side of said channel communicatively connected to said pulse line, a second side of said channel communicatively connected to ground, said second thin film transistor configured to function as a resistor;
a third thin film transistor having a channel formed of a printed p-type organic semiconductor material, a first side of said channel communicatively connected to said pulse line, a second side of said channel communicatively connected to said output node, and further comprising a gate communicatively connected to a first enable signal line; and
a fourth thin film transistor having a channel formed of a printed p-type semiconductor material, a first side of said channel communicatively connected to said pulse line at said output node, a second side of said channel communicatively connected to ground, and further comprising a gate communicatively connected to a second enable signal line.

18. The electronic pulse-generator circuit of claim 17, wherein said first side of said channel of said second thin film transistor is communicatively connected to said pulse line at said output node.

19. The electronic pulse-generator circuit of claim 18, wherein said second thin film transistor further comprises a gate communicatively connected to ground.

\* \* \* \* \*